US007425856B2

United States Patent
Abel et al.

(10) Patent No.: US 7,425,856 B2
(45) Date of Patent: Sep. 16, 2008

(54) PHASE INTERPOLATOR WITH OUTPUT AMPLITUDE CORRECTION

(75) Inventors: Christopher J. Abel, Coplay, PA (US); Joseph Anidjar, Asbury, NJ (US); Vladimir Sindalovsky, Perkasie, PA (US); Craig B. Ziemer, Fleetwood, PA (US)

(73) Assignee: Agere Systems Inc., Allentown, PA (US)

( * ) Notice: Subject to any disclaimer, the term of this patent is extended or adjusted under 35 U.S.C. 154(b) by 123 days.

(21) Appl. No.: 11/479,749

(22) Filed: Jun. 30, 2006

(65) Prior Publication Data

US 2008/0001644 A1    Jan. 3, 2008

(51) Int. Cl.
*H03H 11/16* (2006.01)
(52) U.S. Cl. .................. 327/231; 327/234; 327/359
(58) Field of Classification Search ................. 327/231, 327/233–235, 237, 246, 355, 356, 359
See application file for complete search history.

(56) References Cited

U.S. PATENT DOCUMENTS

| 6,335,697 | B1 * | 1/2002 | Guyot et al. ............... 341/102 |
| 6,359,486 | B1 * | 3/2002 | Chen .......................... 327/231 |
| 6,597,212 | B1 * | 7/2003 | Wang et al. ................. 327/117 |
| 6,943,606 | B2 * | 9/2005 | Dunning et al. ............ 327/231 |
| 7,009,431 | B2 * | 3/2006 | Panikkar et al. ............ 327/156 |
| 7,298,195 | B2 * | 11/2007 | Freyman et al. ............ 327/247 |

\* cited by examiner

*Primary Examiner*—Kenneth B. Wells
*Assistant Examiner*—Hai L. Nguyen
(74) *Attorney, Agent, or Firm*—Mendelsohn & Associates; Steve Mendelsohn (57) ABSTRACT

A phase interpolator generates a phase-interpolated output clock signal Z from two phase-offset input clock signals A and B, where the interpolation angle of the output clock is based on a weight value W. The phase interpolator has A-side and B-side circuitry, each having (1) an array of parallel current mirrors, (2) a block of parallel switches, where each switch is connected in series with a corresponding current mirror, and (3) an encoder that controls the corresponding switches based on the weight value W. The total current through the phase interpolator varies with interpolation angle, such that, for example, the variation in output amplitude with interpolation angle is reduced. In general, individual bit values in weight value W are not used to control individual switches for all interpolation angles.

20 Claims, 5 Drawing Sheets

PHASE INTERPOLATOR WITH OUTPUT AMPLITUDE CORRECTION

BACKGROUND OF THE INVENTION

1. Field of the Invention

The present invention relates to electronics, and, in particular, to phase interpolator circuits that generate a selected phase-interpolated output clock signal from two phase-offset input clock signals.

2. Description of the Related Art

Figure 1:
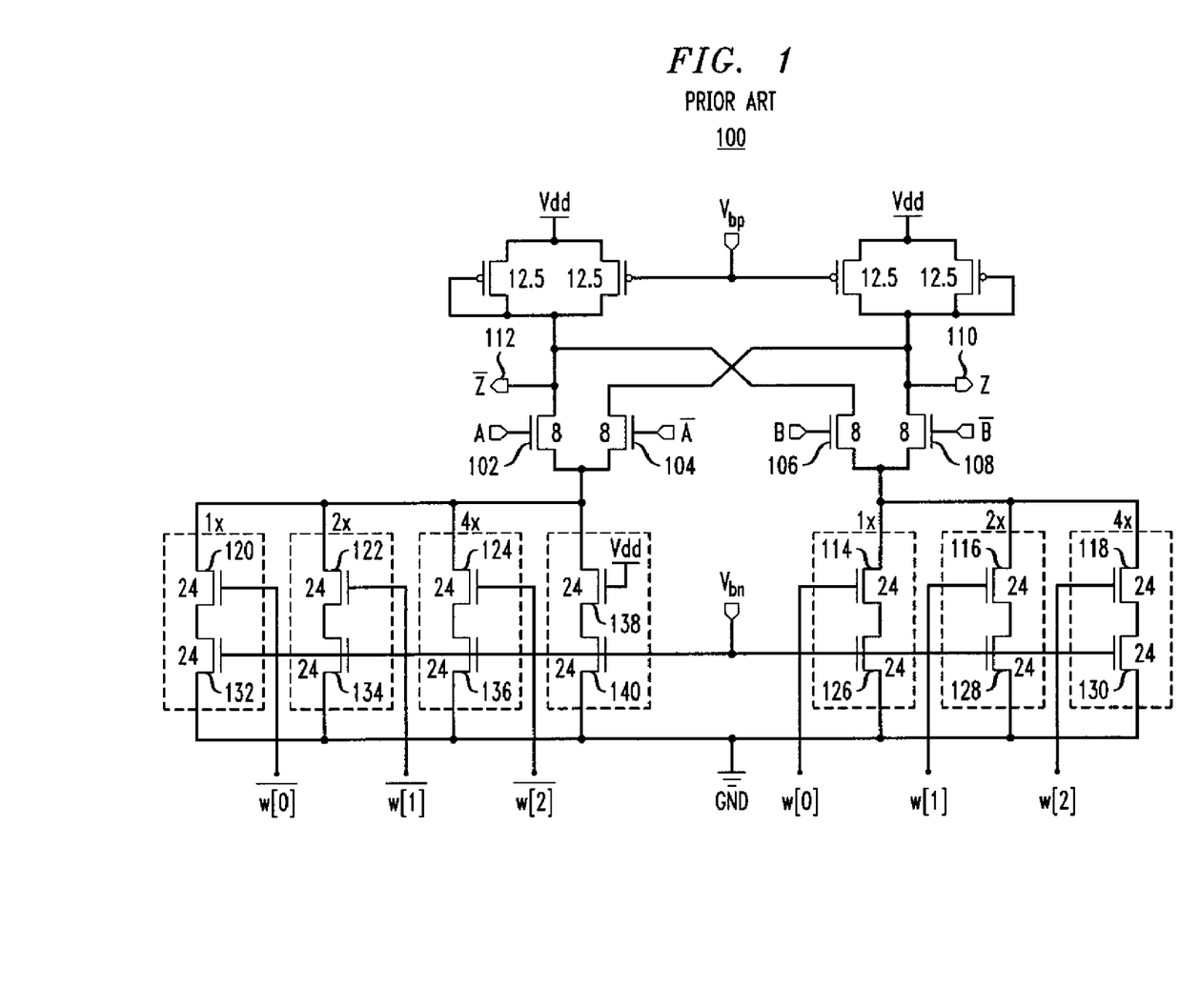
FIG. 1 shows a schematic circuit diagram of a prior-art phase interpolator.

FIG. 1 shows a schematic circuit diagram of a prior-art phase interpolator 100, which receives two phase-offset input clock signals A and B and generates a phase-interpolated output clock signal Z, whose phase is interpolated between the phases of clocks A and B based on a 3-bit weighting value w. In particular, input clock signals A and B and their complements are applied at the gates of NFETs 102-108, output clock signal Z and its complement appear at nodes 110 and 112, and the three bits of weight value w and their complements are applied to the gates of (NFET) switches 114-124. Each switch is connected in series to a corresponding (NFET) current source 126-136. The sizes of the different NFETs used for the switches and current sources are such that, when the corresponding switch is turned on, the current through current source 130 is twice the current through current source 128, which is twice the current through current source 126. Similarly, the current through current source 136 is twice the current through current source 134, which is twice the current through current source 132. In addition, as shown in FIG. 1, the left side of phase interpolator 100 has an additional transistor pair consisting of switch 138 and current source 140, which is always on (due to the gate of switch 138 being connected to Vdd). The current through this additional transistor pair is selected to achieve the results shown in Table I.

Table I shows the different phases of output clock Z for different weighting values w when input clocks A and B are offset by 90 degrees (in particular, when the phase of clock A is 0 degrees, and the phase of clock B is 90 degrees). Greater numbers of different interpolated phase values between 0 and 90 degrees can be achieved by connecting additional, appropriately sized switch/current source pairs on each side of phase interpolator 100 and using weight values having a corresponding additional number of bits.

TABLE I

PRIOR-ART OUTPUT PHASES

| w[2] | w[1] | w[0] | Output phase (degrees) |
|------|------|------|------------------------|
| 0 | 0 | 0 | 0 |
| 0 | 0 | 1 | 11.25 |
| 0 | 1 | 0 | 22.5 |
| 0 | 1 | 1 | 33.75 |
| 1 | 0 | 0 | 45 |
| 1 | 0 | 1 | 56.25 |
| 1 | 1 | 0 | 67.5 |
| 1 | 1 | 1 | 78.75 |

Figure 2:
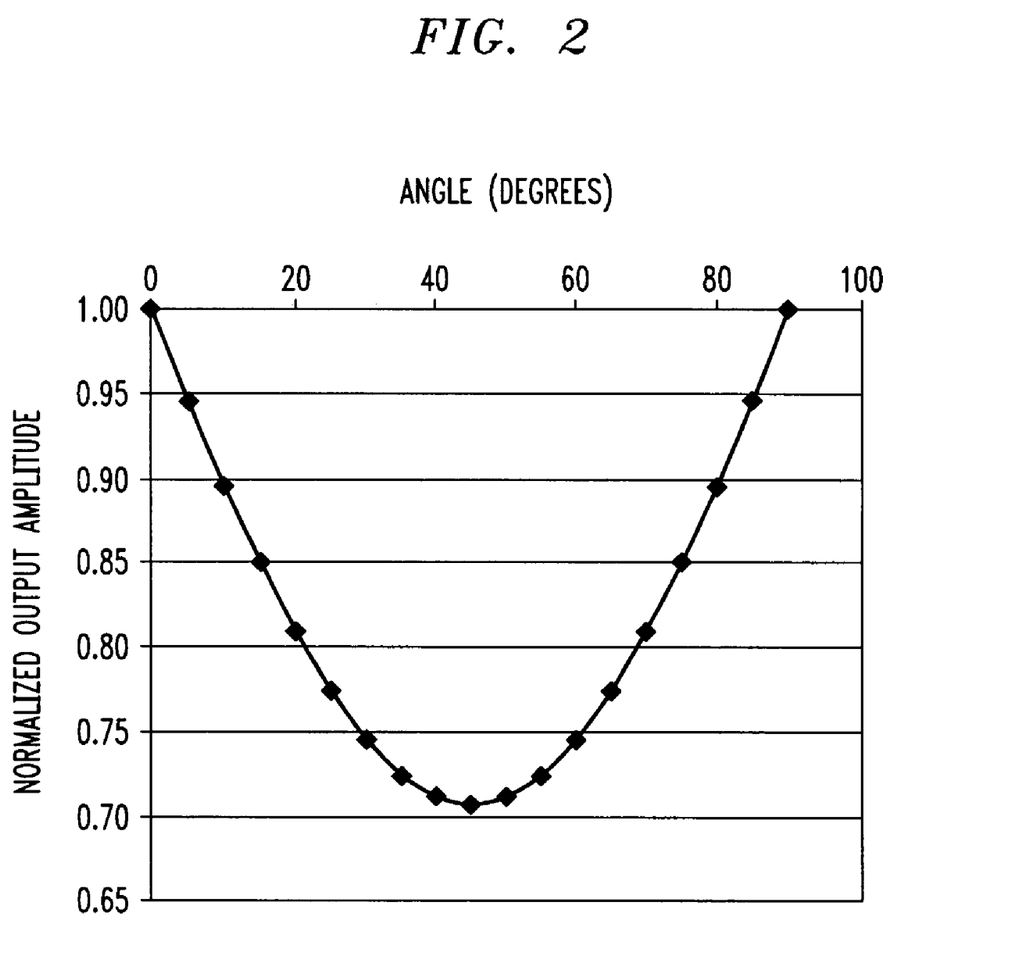
FIG. 2 shows a plot of the normalized amplitude of the output clock Z of FIG. 1 for different output phases between 0 and 90 degrees.

FIG. 2 shows a plot of the amplitude of output clock Z of FIG. 1 for different output phases between 0 and 90 degrees, normalized for 0 degrees (i.e., where output clock signal Z is based entirely on input clock A) and at 90 degrees (i.e., where output clock Z is based entirely on input clock B). As shown in FIG. 2, the output amplitude drops by almost 30% at a 45-degree interpolated phase angle. This amplitude variation with interpolation angle can result in errors in downstream circuitry that relies on phase-interpolated output clock Z for its processing.

SUMMARY OF THE INVENTION

In one embodiment, the present invention is a phase interpolator adapted to generate a phase-interpolated output clock signal Z from two phase-offset input clock signals A and B, wherein interpolation angle of the output clock signal Z is based on an applied weight value W, the phase interpolator comprising A-side circuitry and B-side circuitry connected to the A-side circuitry. The A-side circuitry is adapted to receive the input clock signal A, the B-side circuitry is adapted to receive the input clock signal B, and the output clock signal Z is presented at an output node of the phase interpolator. Each of the A-side circuitry and the B-side circuitry comprises (1) a current source array comprising a plurality of parallel current sources, (2) a switch block comprising a plurality of switches, each switch connected in series to a corresponding current source, and (3) an encoder adapted to control the switches in the switch block based on the weight value W, such that total current through the phase interpolator varies with the interpolation angle of the output clock signal Z.

In another embodiment, the present invention is a method for generating a phase-interpolated output clock signal Z from two phase-offset input clock signals A and B using such a phase interpolator. The method comprises (1) applying the input clock signal A to the A-side circuitry, (2) applying the input clock signal B to the B-side circuitry, and (3) receiving the output clock signal Z at an output node of the phase interpolator.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

As described above in reference to prior-art phase interpolator 100 of FIG. 1, the weighting value applied to switches 120-124 is the complement of the weighting value w applied to switches 114-118. For current sources 126-136, this means that the total current through phase interpolator 100 (i.e., the sum of the current through the A-side (the left side of FIG. 1)

and the current through the B-side (the right side of FIG. 1)) is constant over the entire phase-interpolation range. As a result, the normalized magnitude of output signal Z is given by Equation (1) as follows:

$$Z=\sqrt{\alpha^2+(1-\alpha)^2}, \quad (1)$$

where $\alpha$ is the normalized interpolation angle (i.e., the interpolation angle in degrees divided by 90). The results plotted in FIG. 2 conform with Equation (1). On the other hand, to achieve constant amplitude of the interpolated output signal, the quadrature offset A and B components should be the sine and cosine functions, respectively, of the interpolation angle, such that Equation (2) is satisfied, as follows:

$$Z=\sqrt{\sin^2(\alpha)+\cos^2(\alpha)}. \quad (2)$$

Figure 3:
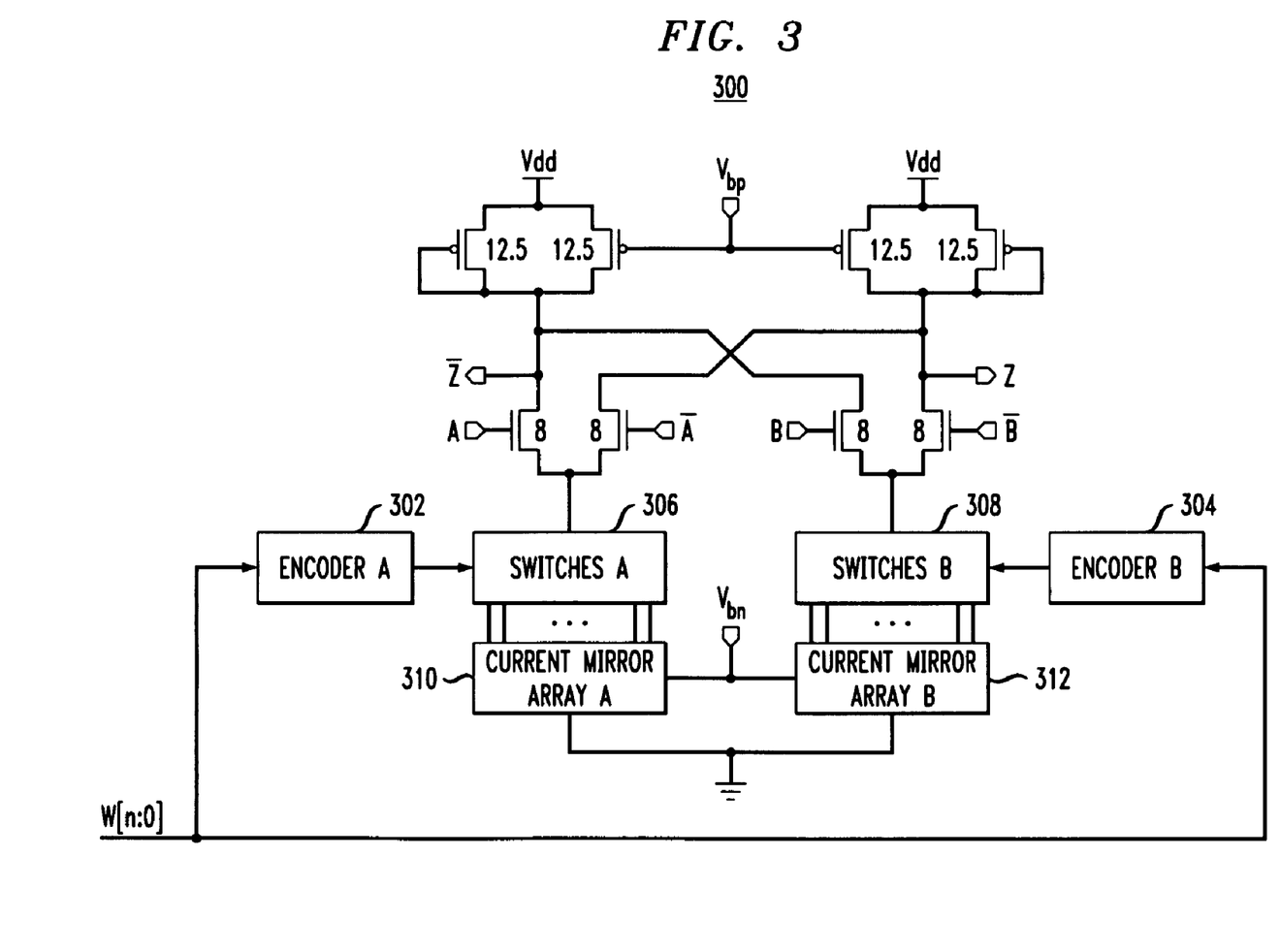
FIG. 3 shows a schematic block diagram of a phase interpolator according to one embodiment of the present invention.

FIG. 3 shows a schematic block diagram of a phase interpolator 300, according to one embodiment of the present invention. As shown in FIG. 3, the top portion of phase interpolator 300 is analogous to the top portion of prior-art phase interpolator 100 of FIG. 1, with input clocks A and B and their complements being applied to analogous input nodes and phase-interpolated output clock Z and its complement appearing at analogous output nodes.

The bottom portion of phase interpolator 300 is represented in FIG. 3 at a block level. In particular, phase interpolator 300 includes encoders 302 and 304, switch blocks 306 and 308, and current mirror arrays 310 and 312. Each switch block contains a set of parallel switches, and each current mirror array contains a set of parallel current mirrors, where each switch is connected in series to a corresponding current mirror, similar to the configuration shown in FIG. 1.

Unlike prior-art phase interpolator 100 of FIG. 1, in which weight value w is applied directly to one set of switches, while the complement of weight value w is applied directly to the other set of switches, in phase interpolator 300, weight value W is applied to encoders 302 and 304, where encoder 302 controls the switches in switch block 306 based on weight value W, and encoder 304 independently controls the switches in switch block 308 based on weight value W.

Although it is possible for some values of W, in general, the individual bit values of weight value W are not directly applied to control different individual switches in switch blocks 306 and 308 for all values of W, as is the case in prior-art phase interpolator 100 of FIG. 1. Similarly, although it is possible for some values of W, in general, the control of switches in switch block 306 is not required to be the complement of the control of switches in switch block 308 for all values of W, as is the case in prior-art phase interpolator 100. In addition, although it is possible for the sizes of certain current mirrors in array 310 and in array 312 to have a 2:1 ratio, in general, the sizes of current mirrors in arrays 310 and 312 are not required to have a 2:1 ratio, as is the case in prior-art phase interpolator 100. Rather, encoders 302 and 304 and the number and sizes of current mirrors in arrays 310 and 312 are designed such that the total current through phase interpolator 300 varies with interpolation angle such that the variation in output amplitude with interpolation angle is reduced.

According to Equation (1) and as indicated in FIG. 2, at a 45-degree interpolation angle, the amplitude of output signal Z will be at 70.7% of the output signal amplitude at 0 or 90 degrees. If the A-side and B-side currents were both scaled up by a factor of 1.41, then the output signal amplitude at 45 degrees would be equal to the output signal amplitudes at 0 and 90 degrees. One possible scheme for reducing output amplitude variation with interpolation angle is to apply linear amplitude correction, where the A-side and B-side currents are scaled up using a correction factor that is generated using (i) a linear function of interpolation angle between 1 (i.e., the ideal correction factor at 0 degrees) and 1.41 (i.e., the ideal correction factor at 45 degrees) for interpolation angles between 0 and 45 degrees and (ii) a linear function of interpolation angle between 1.41 and 1 (i.e., the ideal correction factor at 90 degrees) for interpolation angles between 45 and 90 degrees.

Figure 4:
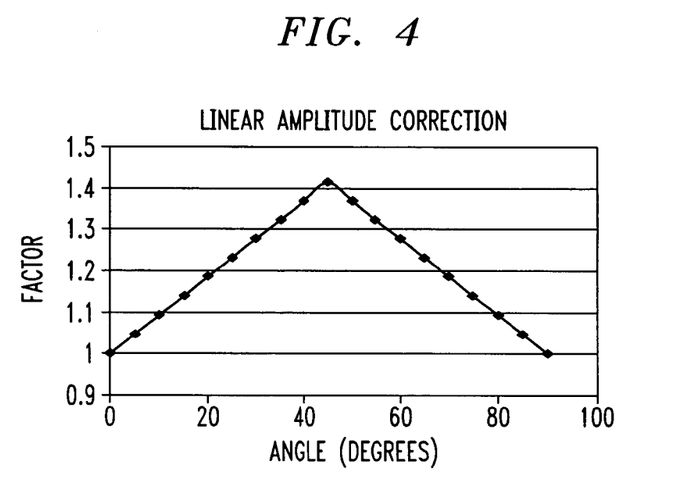
FIG. 4 shows a graph of linear amplitude correction factors.

FIG. 4 shows a graph of these linear amplitude correction factors, and Table II compares the prior-art (i.e., unscaled) results (Columns B-D) with scaled results (Columns F-H) using the linear amplitude correction factors of FIG. 4 (Column E) for interpolated phase angles from 0 to 90 degrees (Column A). In particular, Columns B and C represent the unscaled A-side and B-side currents, respectively, and Column D represents the amplitude of prior-art output signal Z (according to Equation (1) using the unscaled A-side and B-side currents), which corresponds to the results plotted in FIG. 2. Column E represents the linear correction factors, Columns F and G represents the scaled A-side and B-side currents, respectively (derived by multiplying the unscaled A-side and B-side currents by the corresponding linear correction factor), and Column H represents the corresponding scaled amplitude of output signal Z (according to Equation (1) using the scaled A-side and B-side currents).

TABLE II

LINEAR CORRECTION FACTOR

| (A) Phase (deg) | (B) Unscaled A-Side | (C) Unscaled B-Side | (D) Output Amplitude (Unscaled) | (E) Linear Correction Factor | (F) Scaled A-Side | (G) Scaled B-Side | (H) Output Amplitude (Scaled) |
|---|---|---|---|---|---|---|---|
| 0 | 1 | 0 | 1 | 1 | 1 | 0 | 1 |
| 5 | 0.94 | 0.06 | 0.94 | 1.05 | 0.99 | 0.06 | 0.99 |
| 10 | 0.89 | 0.11 | 0.90 | 1.09 | 0.97 | 0.12 | 0.98 |
| 15 | 0.83 | 0.17 | 0.85 | 1.14 | 0.95 | 0.19 | 0.97 |
| 20 | 0.78 | 0.22 | 0.81 | 1.18 | 0.92 | 0.26 | 0.96 |
| 25 | 0.72 | 0.28 | 0.77 | 1.23 | 0.89 | 0.34 | 0.95 |
| 30 | 0.67 | 0.33 | 0.75 | 1.28 | 0.86 | 0.42 | 0.96 |
| 35 | 0.61 | 0.39 | 0.72 | 1.32 | 0.81 | 0.51 | 0.96 |
| 40 | 0.56 | 0.44 | 0.71 | 1.37 | 0.77 | 0.60 | 0.98 |
| 45 | 0.50 | 0.50 | 0.71 | 1.41 | 0.71 | 0.71 | 1.00 |
| 50 | 0.44 | 0.56 | 0.71 | 1.37 | 0.60 | 0.77 | 0.98 |
| 55 | 0.39 | 0.61 | 0.72 | 1.32 | 0.51 | 0.81 | 0.96 |

TABLE II-continued

LINEAR CORRECTION FACTOR

| (A) Phase (deg) | (B) Unscaled A-Side | (C) Unscaled B-Side | (D) Output Amplitude (Unscaled) | (E) Linear Correction Factor | (F) Scaled A-Side | (G) Scaled B-Side | (H) Output Amplitude (Scaled) |
|---|---|---|---|---|---|---|---|
| 60 | 0.33 | 0.67 | 0.75 | 1.28 | 0.42 | 0.86 | 0.96 |
| 65 | 0.28 | 0.72 | 0.77 | 1.23 | 0.34 | 0.89 | 0.95 |
| 70 | 0.22 | 0.78 | 0.81 | 1.18 | 0.26 | 0.92 | 0.96 |
| 75 | 0.17 | 0.83 | 0.85 | 1.14 | 0.19 | 0.95 | 0.97 |
| 80 | 0.11 | 0.89 | 0.90 | 1.09 | 0.12 | 0.97 | 0.98 |
| 85 | 0.06 | 0.94 | 0.94 | 1.05 | 0.06 | 0.99 | 0.99 |
| 90 | 0 | 1 | 1 | 1.0 | 0 | 1 | 1 |

Figure 5:
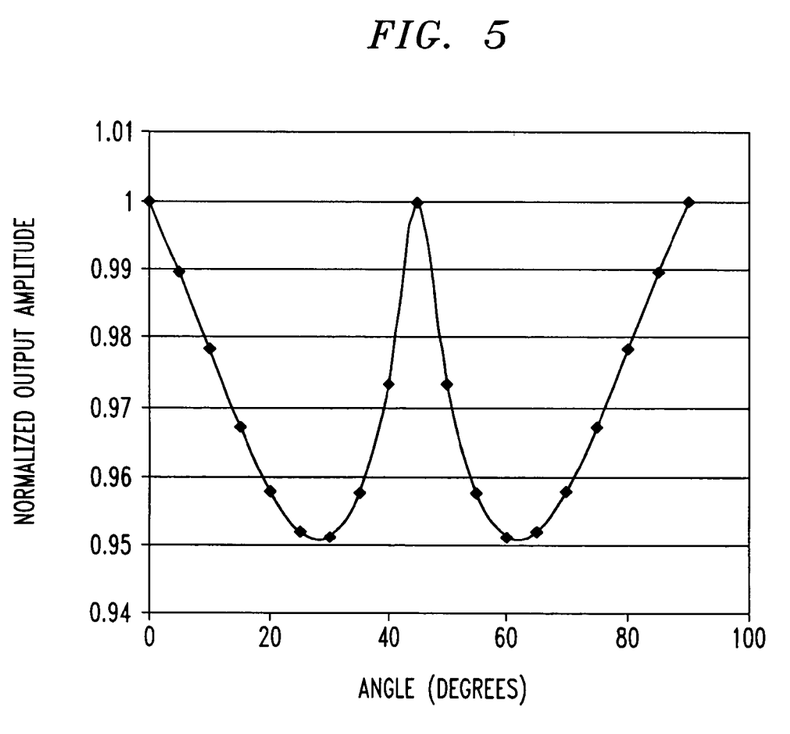
FIG. 5 shows a plot of the normalized amplitude of output clock Z of FIG. 3 based on the linear correction factors of FIG. 4 for different output phases between 0 and 90 degrees.

FIG. 5 shows a plot of the amplitude of output clock Z based on the linear correction scheme of FIG. 4 and Table II for different output phases between 0 and 90 degrees, normalized for 0 and 90 degrees. FIG. 5 corresponds to the results shown in Column H of Table II. Comparing the prior-art, unscaled results of FIG. 2 with the scaled results of FIG. 5, the maximum deviation in output amplitude has been reduced from almost 30% (at 45 degrees) in FIG. 2 to less than 5% (at 22.5 and 67.5 degrees) in FIG. 5.

Figure 6:
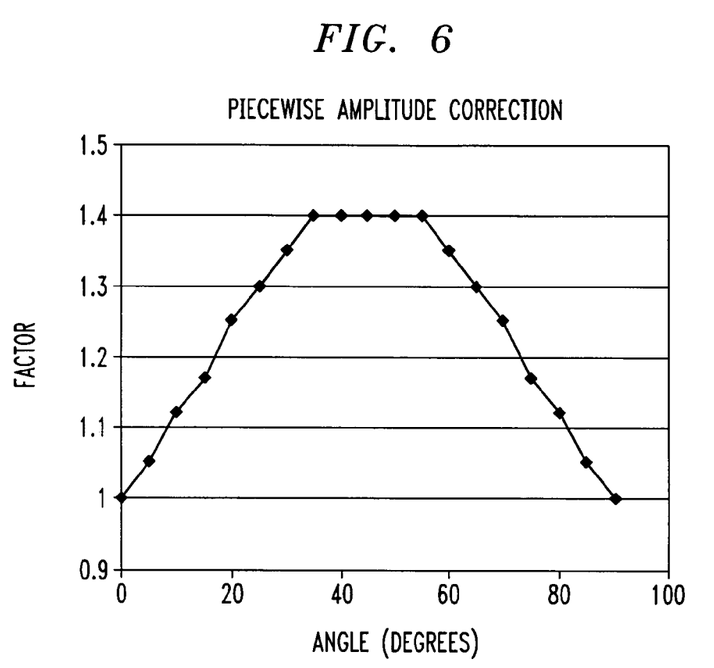
FIG. 6 shows a graph of piecewise amplitude correction factors.
Figure 7:
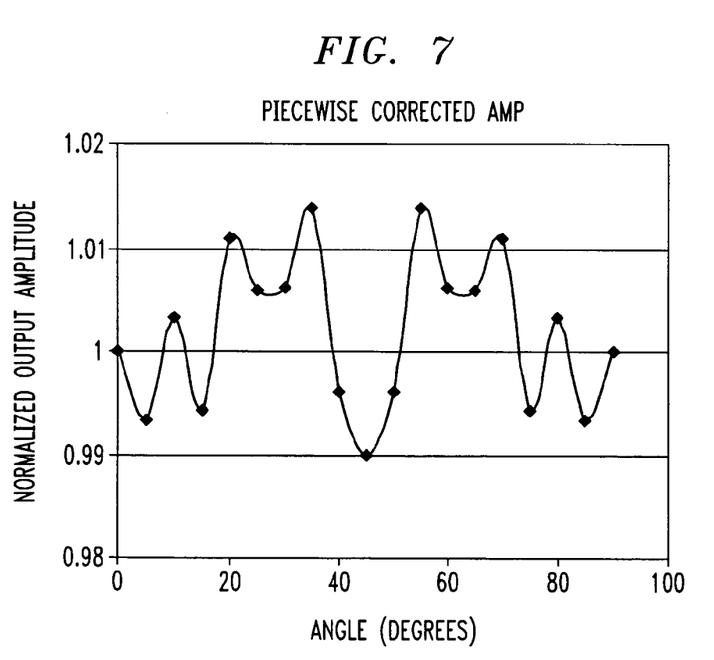
FIG. 7 shows a plot of the normalized amplitude of output clock Z of FIG. 3 based on the piecewise correction factors of FIG. 6 for different output phases between 0 and 90 degrees.

If, instead of applying the linear amplitude correction scheme of FIG. 4, the piecewise amplitude correction scheme of FIG. 6 is applied, then the variation in output signal amplitude with interpolation angle can be reduced even further, with the resulting normalized output amplitudes plotted in FIG. 7, where the maximum deviation (at 35 and 55 degrees) is less than 1.5%. Table III tabulates the results using the piecewise amplitude correction scheme of FIG. 6.

TABLE III

PIECEWISE CORRECTION FACTOR

| (A) Phase (deg) | (B) Unscaled A-Side | (C) Unscaled B-Side | (D) Output Amplitude (Unscaled) | (E) Piecewise Correction Factor | (F) Scaled A-Side | (G) Scaled B-Side | (H) Output Amplitude (Scaled) |
|---|---|---|---|---|---|---|---|
| 0 | 1 | 0 | 1 | 1.0 | 1 | 0.00 | 1.00 |
| 5 | 0.94 | 0.06 | 0.95 | 1.05 | 0.99 | 0.06 | 0.99 |
| 10 | 0.89 | 0.11 | 0.90 | 1.12 | 1.00 | 0.12 | 1.00 |
| 15 | 0.83 | 0.17 | 0.85 | 1.17 | 0.98 | 0.20 | 0.99 |
| 20 | 0.78 | 0.22 | 0.81 | 1.25 | 0.97 | 0.28 | 1.01 |
| 25 | 0.72 | 0.28 | 0.77 | 1.30 | 0.94 | 0.36 | 1.01 |
| 30 | 0.67 | 0.33 | 0.75 | 1.35 | 0.90 | 0.45 | 1.01 |
| 35 | 0.61 | 0.39 | 0.72 | 1.40 | 0.86 | 0.54 | 1.01 |
| 40 | 0.56 | 0.44 | 0.71 | 1.40 | 0.78 | 0.62 | 1.00 |
| 45 | 0.50 | 0.50 | 0.71 | 1.40 | 0.70 | 0.70 | 0.99 |
| 50 | 0.44 | 0.56 | 0.71 | 1.40 | 0.62 | 0.78 | 1.00 |
| 55 | 0.39 | 0.61 | 0.72 | 1.40 | 0.54 | 0.86 | 1.01 |
| 60 | 0.33 | 0.67 | 0.75 | 1.36 | 0.45 | 0.90 | 1.01 |
| 65 | 0.28 | 0.72 | 0.77 | 1.30 | 0.36 | 0.94 | 1.01 |
| 70 | 0.22 | 0.78 | 0.81 | 1.25 | 0.28 | 0.97 | 1.01 |
| 75 | 0.17 | 0.83 | 0.85 | 1.17 | 0.20 | 0.98 | 0.99 |
| 80 | 0.11 | 0.89 | 0.90 | 1.12 | 0.12 | 1.00 | 1.00 |
| 85 | 0.06 | 0.94 | 0.95 | 1.05 | 0.06 | 0.99 | 0.99 |
| 90 | 0 | 1 | 1 | 1.0 | 0.00 | 1.00 | 1.00 |

In order to implement the linear amplitude correction scheme, the encoders, switch blocks, and current mirror arrays of phase interpolator 300 of FIG. 3 should be designed to provide (at least approximations of) the scaled A-side and B-side currents of Columns F and G of Table II at the corresponding interpolation angles. In theory, this can be achieved by providing, for each different interpolation angle, a different, appropriately sized A-side switch/current mirror pair and a different, appropriately sized B-side switch/current mirror pair. Alternatively, reduced sets of switch/current mirror pairs for the A-side and B-side can be derived such that each different interpolation angle is achieved (or at least approximated) using different combinations of one or more switch/current mirror pairs.

Other amplitude correction schemes, besides the linear scheme of FIGS. 4-5 and Table II and the piecewise scheme of FIGS. 6-7 and Table III, are also possible. The design of a particular amplitude correction scheme will depend on the requirements of the particular application. In general, the greater the reduction in output amplitude variation with interpolation angle, the greater the complexity of the implementation of the corresponding amplitude correction scheme.

No matter what amplitude correction scheme is selected to reduce output amplitude variation with interpolation angle, such a scheme can be implemented by designing the encoders, switch blocks, and current mirror arrays of phase interpolator 300 of FIG. 3 to provide (at least approximations of)

the corresponding scaled A-side and B-side currents at the corresponding interpolation angles.

Although the present invention has been described in the context of phase interpolator 300 of FIG. 3, the invention is not so limited. In general, phase interpolators of the present invention may be implemented using:

- Current sources other than NFET-based current mirrors, such as current mirrors based on PFETs (if the whole interpolator uses PFETs in the lower part of the circuitry and NFETs as the load) or current mirrors based on bipolar transistors.
- Switches other than NFET-based switches, such as switches based on PFETs or bipolar transistors; and/or
- Circuitry that differs from the top portion of phase interpolator 300, such as circuitry based on NFET loads, bipolar transistors, or resistor loads.

In general, phase interpolators of the present invention may be implemented using integrated circuit technology other than FET-based devices, such as bipolar devices.

The present invention may be implemented as (analog, digital, or a hybrid of both analog and digital) circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing blocks in a software program. Such software may be employed in, for example, a digital signal processor, microcontroller, or general-purpose computer.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

We claim:

1. A phase interpolator adapted to generate a phase-interpolated output clock signal Z from two phase-offset input clock signals A and B, wherein interpolation angle of the output clock signal Z is based on an applied weight value W, the phase interpolator comprising A-side circuitry and B-side circuitry connected to the A-side circuitry, wherein:
   the A-side circuitry is adapted to receive the input clock signal A;
   the B-side circuitry is adapted to receive the input clock signal B;
   the output clock signal Z is presented at an output node of the phase interpolator; and
   each of the A-side circuitry and the B-side circuitry comprises:
      a current source array comprising a plurality of parallel current sources;
      a switch block comprising a plurality of switches, each switch connected in series to a corresponding current source; and
      an encoder adapted to control the switches in the switch block based on the weight value W, such that total current through the phase interpolator varies with the interpolation angle of the output clock signal Z.

2. The invention of claim 1, wherein the variation in the total current with the interpolation angle reduces variation in amplitude of the output clock signal Z with the interpolation angle.

3. The invention of claim 1, wherein, for at least one weight value W corresponding to at least one interpolation angle, the A-side encoder is adapted to turn on a subset of switches in the A-side switch block that is not the complement of a subset of switches turned on in the B-side switch block by the B-side encoder for the same weight value W.

4. The invention of claim 1, wherein the total current through the phase interpolator varies (1) linearly from an interpolation angle of 0 degrees to an interpolation angle of 45 degrees and (2) linearly from the 45-degree interpolation angle to an interpolation angle of 90 degrees.

5. The invention of claim 1, wherein the total current through the phase interpolator varies linearly within each of more than two different ranges of interpolation angles.

6. The invention of claim 1, wherein pairs of current sources in each current source array do not all conform to a $2^N:1$ size ratio, where N is a positive integer.

7. The invention of claim 1, wherein each encoder is adapted to convert the weight value W such that each individual bit value in the weight value W does not control a different individual switch in the corresponding switch block for at least one interpolation angle.

8. The invention of claim 1, wherein each current source is a transistor-based current mirror.

9. The invention of claim 1, wherein:
   the variation in the total current with the interpolation angle reduces variation in amplitude of the output clock signal Z with the interpolation angle;
   for at least one weight value W corresponding to at least one interpolation angle, the A-side encoder is adapted to turn on a subset of switches in the A-side switch block that is not the complement of a subset of switches turned on in the B-side switch block by the B-side encoder for the same weight value W;
   pairs of current sources in each current source array do not all conform to a 2:1 size ratio;

each encoder is adapted to convert the weight value W such that each individual bit value in the weight value W does not control a different individual switch in the corresponding switch block for at least one interpolation angle; and each current source is a transistor-based current mirror.

10. The invention of claim 9, wherein the total current through the phase interpolator varies (1) linearly from an interpolation angle of 0 degrees to an interpolation angle of 45 degrees and (2) linearly from the 45-degree interpolation angle to an interpolation angle of 90 degrees.

11. The invention of claim 9, wherein the total current through the phase interpolator varies linearly within each of more than two different ranges of interpolation angles.

12. A method for generating a phase-interpolated output clock signal Z from two phase-offset input clock signals A and B using a phase interpolator, wherein interpolation angle of the output clock signal Z is based on an applied weight value W, the phase interpolator comprising A-side circuitry and B-side circuitry connected to the A-side circuitry, the method comprising:

applying the input clock signal A to the A-side circuitry;

applying the input clock signal B to the B-side circuitry; and receiving the output clock signal Z at an output node of the phase interpolator, wherein each of the A-side circuitry and the B-side circuitry comprises:

a current source array comprising a plurality of parallel current sources;

a switch block comprising a plurality of switches, each switch connected in series to a corresponding current source; and an encoder controlling the switches in the switch block based on the weight value W, such that total current through the phase interpolator varies with the interpolation angle of the output clock signal Z.

13. The invention of claim 12, wherein the variation in the total current with the interpolation angle reduces variation in amplitude of the output clock signal Z with the interpolation angle.

14. The invention of claim 12, wherein, for at least one weight value W corresponding to at least one interpolation angle, the A-side encoder turns on a subset of switches in the A-side switch block that is not the complement of a subset of switches turned on in the B-side switch block by the B-side encoder for the same weight value W.

15. The invention of claim 12, wherein the total current through the phase interpolator varies (1) linearly from an interpolation angle of 0 degrees to an interpolation angle of 45 degrees and (2) linearly from the 45-degree interpolation angle to an interpolation angle of 90 degrees.

16. The invention of claim 12, wherein the total current through the phase interpolator varies linearly within each of more than two different ranges of interpolation angles.

17. The invention of claim 12, wherein pairs of current sources in each current source array do not all conform to a $2^N:1$ size ratio, where N is a positive integer.

18. The invention of claim 12, wherein each encoder converts the weight value W such that each individual bit value in the weight value W does not control a different individual switch in the corresponding switch block for at least one interpolation angle.

19. The invention of claim 12, wherein each current source is a transistor-based current mirror.

20. The invention of claim 12, wherein:

the variation in the total current with the interpolation angle reduces variation in amplitude of the output clock signal Z with the interpolation angle;

for at least one weight value W corresponding to at least one interpolation angle, the A-side encoder turns on a subset of switches in the A-side switch block that is not the complement of a subset of switches turned on in the B-side switch block by the B-side encoder for the same weight value W;

pairs of current sources in each current source array do not all conform to a 2:1 size ratio;

each encoder converts the weight value W such that each individual bit value in the weight value W does not control a different individual switch in the corresponding switch block for at least one interpolation angle; and each current source is a transistor-based current mirror.

* * * * *